United States Patent
Enicks et al.

(10) Patent No.: US 8,530,934 B2
(45) Date of Patent: Sep. 10, 2013

(54) INTEGRATED CIRCUIT STRUCTURES CONTAINING A STRAIN-COMPENSATED COMPOUND SEMICONDUCTOR LAYER AND METHODS AND SYSTEMS RELATED THERETO

(75) Inventors: Darwin G. Enicks, Painted Post, NY (US); John Taylor Chaffee, Colorado Springs, CO (US); Damian A. Carver, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/901,867

(22) Filed: Oct. 11, 2010

(65) Prior Publication Data

US 2011/0073907 A1    Mar. 31, 2011

Related U.S. Application Data

(63) Continuation-in-part of application No. 11/268,154, filed on Nov. 7, 2005, now abandoned.

(51) Int. Cl.
    *H01L 21/02*    (2006.01)
(52) U.S. Cl.
    USPC ........... 257/190; 438/312; 438/309; 257/235; 257/E29.068; 257/E21.371
(58) Field of Classification Search
    USPC ......... 438/235, 309, 312; 257/190, E21.371, 257/E29.068
    See application file for complete search history.

(56) References Cited

U.S. PATENT DOCUMENTS

| | | |
|---|---|---|
| 4,459,739 A | 7/1984 | Shepard et al. |
| 4,652,183 A | 3/1987 | Veltri et al. |
| 4,701,423 A | 10/1987 | Szluk |
| 4,908,325 A | 3/1990 | Berenz |
| 5,137,838 A | 8/1992 | Ramde et al. |
| 5,155,571 A | 10/1992 | Wang et al. |
| 5,177,583 A | 1/1993 | Endo et al. |
| 5,241,214 A | 8/1993 | Herbots |
| 5,331,659 A | 7/1994 | Ohata et al. |
| 5,378,901 A | 1/1995 | Nii |
| 5,466,949 A | 11/1995 | Okuno |
| 5,569,538 A | 10/1996 | Cho |

(Continued)

FOREIGN PATENT DOCUMENTS

WO    WO-2007001672 A2    1/2007
WO    WO-2007001672 A3    1/2007

(Continued)

OTHER PUBLICATIONS

"U.S. Appl. No. 11/166,287, Response filed Jun. 30, 2008 to Non-Final Office Action mailed Apr. 3, 2008", 16 pgs.

(Continued)

*Primary Examiner* — Jarrett Stark
(74) *Attorney, Agent, or Firm* — Fish & Richardson P.C.

(57) ABSTRACT

A method for pseudomorphic growth and integration of an in-situ doped, strain-compensated metastable compound base into an electronic device, such as, for example, a SiGe NPN HBT, by substitutional placement of strain-compensating atomic species. The invention also applies to strained layers in other electronic devices such as strained SiGe, Si in MOS applications, vertical thin film transistors (VTFT), and a variety of other electronic device types. Devices formed from compound semiconductors other than SiGe, such as, for example, GaAs, InP, and AlGaAs are also amenable to beneficial processes described herein.

15 Claims, 3 Drawing Sheets

(56) References Cited

U.S. PATENT DOCUMENTS

| | | | |
|---|---|---|---|
| 5,620,907 A | 4/1997 | Jalali-Farahani et al. |
| 5,661,059 A | 8/1997 | Liu et al. |
| 5,686,350 A | 11/1997 | Lee et al. |
| 5,804,834 A | 9/1998 | Shimoyama et al. |
| 5,856,685 A | 1/1999 | Nakayama |
| 5,906,708 A | 5/1999 | Robinson et al. |
| 5,906,951 A | 5/1999 | Chu et al. |
| 5,965,931 A | 10/1999 | Wang et al. |
| 6,059,895 A | 5/2000 | Chu et al. |
| 6,064,081 A | 5/2000 | Robinson et al. |
| 6,087,683 A | 7/2000 | King et al. |
| 6,107,647 A | 8/2000 | Matsumoto et al. |
| 6,165,891 A | 12/2000 | Chooi et al. |
| 6,323,108 B1 | 11/2001 | Kub et al. |
| 6,399,970 B2 | 6/2002 | Kubo et al. |
| 6,512,252 B1 | 1/2003 | Takagi et al. |
| 6,521,041 B2 | 2/2003 | Wu et al. |
| 6,531,369 B1 | 3/2003 | Ozkan et al. |
| 6,552,375 B2 | 4/2003 | Swanson et al. |
| 6,586,297 B1 | 7/2003 | U'Ren et al. |
| 6,593,625 B2 | 7/2003 | Chritiansen et al. |
| 6,656,809 B2 | 12/2003 | Greenberg et al. |
| 6,667,489 B2 | 12/2003 | Suzumura et al. |
| 6,670,542 B2 | 12/2003 | Sakata et al. |
| 6,670,654 B2 | 12/2003 | Lanzerotti et al. |
| 6,680,494 B2 | 1/2004 | Gutierrez-Aitken et al. |
| 6,709,903 B2 | 3/2004 | Christiansen et al. |
| 6,744,079 B2 | 6/2004 | Jagannathan et al. |
| 6,746,902 B2 | 6/2004 | Maa et al. |
| 6,750,484 B2 | 6/2004 | Lippert et al. |
| 6,759,694 B1 | 7/2004 | Hsu et al. |
| 6,780,796 B2 | 8/2004 | Maa et al. |
| 6,781,214 B1 | 8/2004 | U'Ren et al. |
| 6,787,822 B1 | 9/2004 | Nuyen |
| 6,841,457 B2 | 1/2005 | Bedell et al. |
| 6,855,649 B2 | 2/2005 | Christiansen et al. |
| 6,855,963 B1 | 2/2005 | Chu et al. |
| 6,858,541 B2 | 2/2005 | Horning |
| 6,876,010 B1 | 4/2005 | Fitzgerald |
| 6,900,115 B2 | 5/2005 | Todd |
| 6,906,400 B2 | 6/2005 | Delhougne et al. |
| 6,927,140 B2 | 8/2005 | Soman et al. |
| 6,936,910 B2 | 8/2005 | Ellis-Monaghan et al. |
| 6,963,089 B2 | 11/2005 | Shi et al. |
| 6,992,004 B1 | 1/2006 | Besser et al. |
| 6,995,430 B2 | 2/2006 | Langdo et al. |
| 7,074,623 B2 | 7/2006 | Lochtefeld et al. |
| 7,091,114 B2 | 8/2006 | Ito et al. |
| 7,227,176 B2 | 6/2007 | Wu et al. |
| 7,273,799 B2 | 9/2007 | Todd |
| 7,495,250 B2 | 2/2009 | Enicks |
| 7,517,768 B2 * | 4/2009 | Soman et al. ............ 438/309 |
| 7,550,758 B2 | 6/2009 | Enicks |
| 7,569,913 B2 | 8/2009 | Enicks |
| 2001/0035863 A1 * | 11/2001 | Kimura ............ 345/205 |
| 2002/0008289 A1 | 1/2002 | Murota et al. |
| 2002/0081861 A1 | 6/2002 | Robinson et al. |
| 2002/0105015 A1 | 8/2002 | Kubo et al. |
| 2002/0185686 A1 | 12/2002 | Christiansen et al. |
| 2003/0040130 A1 | 2/2003 | Mayur et al. |
| 2003/0080394 A1 | 5/2003 | Babcock et al. |
| 2003/0082882 A1 | 5/2003 | Babcock et al. |
| 2003/0098465 A1 | 5/2003 | Suzumura et al. |
| 2003/0129802 A1 | 7/2003 | Lanzerotti et al. |
| 2003/0132453 A1 | 7/2003 | Greenberg et al. |
| 2003/0140844 A1 | 7/2003 | Maa et al. |
| 2003/0143783 A1 | 7/2003 | Maa et al. |
| 2003/0146448 A1 | 8/2003 | U'Ren et al. |
| 2003/0159644 A1 | 8/2003 | Yonehara et al. |
| 2003/0201468 A1 | 10/2003 | Christiansen et al. |
| 2003/0218189 A1 | 11/2003 | Christiansen et al. |
| 2004/0009649 A1 | 1/2004 | Kub et al. |
| 2004/0031979 A1 | 2/2004 | Lochtefeld et al. |
| 2004/0048439 A1 | 3/2004 | Soman et al. |
| 2004/0048447 A1 | 3/2004 | Kondo |
| 2004/0063293 A1 | 4/2004 | Greenberg et al. |
| 2004/0079989 A1 | 4/2004 | Kaneko et al. |
| 2004/0087119 A1 | 5/2004 | Maa et al. |
| 2004/0164336 A1 | 8/2004 | Weimer et al. |
| 2004/0222486 A1 | 11/2004 | Ellis-Monaghan et al. |
| 2004/0227158 A1 | 11/2004 | Delhougne |
| 2004/0251458 A1 | 12/2004 | Mizushima et al. |
| 2004/0253776 A1 | 12/2004 | Hoffmann et al. |
| 2005/0045905 A1 | 3/2005 | Chu et al. |
| 2005/0045962 A1 | 3/2005 | Iwata et al. |
| 2005/0048745 A1 | 3/2005 | Todd |
| 2005/0051798 A1 | 3/2005 | Lanzerotti et al. |
| 2005/0051861 A1 | 3/2005 | Shi et al. |
| 2005/0092235 A1 | 5/2005 | Brabant et al. |
| 2005/0112857 A1 | 5/2005 | Gluschenkov et al. |
| 2005/0127392 A1 | 6/2005 | Chu et al. |
| 2005/0181555 A1 | 8/2005 | Haukka et al. |
| 2005/0191911 A1 | 9/2005 | Greenberg et al. |
| 2005/0230705 A1 | 10/2005 | Taylor |
| 2005/0233534 A1 | 10/2005 | Lanzerotti et al. |
| 2005/0250289 A1 | 11/2005 | Babcock et al. |
| 2005/0280103 A1 | 12/2005 | Langdo et al. |
| 2006/0011906 A1 | 1/2006 | Bedell et al. |
| 2006/0030093 A1 | 2/2006 | Zhang et al. |
| 2006/0068557 A1 | 3/2006 | Ochimizu et al. |
| 2006/0121692 A1 | 6/2006 | Shiota et al. |
| 2006/0151787 A1 | 7/2006 | Chen et al. |
| 2006/0157733 A1 | 7/2006 | Lucovsky et al. |
| 2006/0186510 A1 | 8/2006 | Lochtefeld et al. |
| 2006/0231862 A1 | 10/2006 | Otsuka et al. |
| 2006/0273392 A1 | 12/2006 | Ito et al. |
| 2006/0284165 A1 | 12/2006 | Berger et al. |
| 2006/0292809 A1 | 12/2006 | Enicks et al. |
| 2007/0048992 A1 | 3/2007 | Hosokawa et al. |
| 2007/0054460 A1 | 3/2007 | Enicks et al. |
| 2007/0087507 A1 | 4/2007 | Liu et al. |
| 2007/0096142 A1 | 5/2007 | Tachibana et al. |
| 2007/0102834 A1 | 5/2007 | Enicks et al. |
| 2007/0105335 A1 | 5/2007 | Fitzgerald |
| 2007/0148890 A1 | 6/2007 | Enicks et al. |
| 2007/0262295 A1 | 11/2007 | Enicks |
| 2007/0290193 A1 | 12/2007 | Tucker |
| 2008/0050883 A1 | 2/2008 | Enicks |
| 2008/0099754 A1 | 5/2008 | Enicks |
| 2008/0099840 A1 | 5/2008 | Enicks |
| 2008/0099882 A1 | 5/2008 | Enicks |
| 2008/0237716 A1 | 10/2008 | Enicks et al. |
| 2009/0258478 A1 | 10/2009 | Enicks |

FOREIGN PATENT DOCUMENTS

| | | |
|---|---|---|
| WO | WO-2007056708 A2 | 5/2007 |
| WO | WO-2007056708 A3 | 5/2007 |
| WO | WO-2007079372 A2 | 7/2007 |
| WO | WO-2007079372 A3 | 7/2007 |
| WO | WO-2007133949 A1 | 11/2007 |
| WO | WO-2008024587 A2 | 2/2008 |
| WO | WO-2008024587 A3 | 2/2008 |
| WO | WO-2008054957 A1 | 5/2008 |
| WO | WO-2008054967 A2 | 5/2008 |
| WO | WO-2008054967 A3 | 5/2008 |
| WO | WO-2008057692 A2 | 5/2008 |
| WO | WO-2008057692 A3 | 5/2008 |
| WO | WO-2008057695 A1 | 5/2008 |

OTHER PUBLICATIONS

"U.S. Appl. No. 11/166,287, Final Office Action mailed Jun. 1, 2009", 13 pgs.

"U.S. Appl. No. 11/166,287, Non-Final Office Action mailed Apr. 3, 2008", 11 pgs.

"U.S. Appl. No. 11/166,287, Non-Final Office Action mailed Nov. 4, 2008", 13 pgs.

"U.S. Appl. No. 11/166,287, Notice of Allowance mailed Oct. 8, 2009", 8 pgs.

"U.S. Appl. No. 11/166,287, Response filed Jan. 23, 2008 to Restriction Requirement mailed Jan. 16, 2008", 1 pg.

"U.S. Appl. No. 11/166,287, Response filed Feb. 3, 2009 to Non-Final Office Action mailed Nov. 4, 2008", 20 pgs.

"U.S. Appl. No. 11/166,287, Response filed Sep. 1, 2009 to Final Office Action mailed Jun. 1, 2009", 15 pgs.

"U.S. Appl. No. 11/166,287, Restriction Requirement mailed Jan. 16, 2008", 5 pgs.

"U.S. Appl. No. 11/268,154, Amendment and Response filed Sep. 7, 2007 to Non-Final Office Action mailed Jun. 7, 2007", 15 pgs.

"U.S. Appl. No. 11/268,154 Final Office Action mailed Jul. 13, 2010", 18 pgs.

"U.S. Appl. No. 11/268,154, Advisory Action mailed Jun. 14, 2010", 3 pgs.

"U.S. Appl. No. 11/268,154, Amendment and Response (w/ Affidavits) filed Feb. 25, 2008 to Non-Final Office Action mailed Oct. 26, 2007", 16 pgs.

"U.S. Appl. No. 11/268,154, Amendment and Response filed May 20, 2008 to Final Office Action mailed Mar. 20, 2008", 12 pgs.

"U.S. Appl. No. 11/268,154, Final Office Action mailed Mar. 20, 2008.", 17 pgs.

"U.S. Appl. No. 11/268,154, Final Office Action mailed Dec. 23, 2008", 19 pgs.

"U.S. Appl. No. 11/268,154, Non-Final Office Action mailed Jun. 7, 2007", 10 pgs.

"U.S. Appl. No. 11/268,154, Non-Final Office Action mailed Jun. 29, 2009", 16 pgs.

"U.S. Appl. No. 11/268,154, Non-Final Office Action mailed Aug. 4, 2008", 19 pgs.

"U.S. Appl. No. 11/268,154, Non-Final Office Action mailed Oct. 26, 2007", 15 pgs.

"U.S. Appl. No. 11/268,154, Non-Final Office Action mailed Nov. 19, 2009", 13 pgs.

"U.S. Appl. No. 11/268,154, Response filed Feb. 19, 2010 to Non Final Office Action mailed Nov. 19, 2009", 9 pgs.

"U.S. Appl. No. 11/268,154, Response filed Feb. 23, 2009 to Final Office Action mailed Dec. 23, 2008", 10 pgs.

"U.S. Appl. No. 11/268,154, Response filed May 26, 2009 to Final Office Action mailed Dec. 23, 2008 and Advisory Action mailed Apr. 10, 2009", 9 pgs.

"U.S. Appl. No. 11/268,154, Response filed Jun. 1, 2010 to Final Office Action mailed Apr. 1, 2010", 15 pgs.

"U.S. Appl. No. 11/268,154, Response filed Sep. 29, 2009 to Non Final Office Action mailed Jun. 29, 2009", 9 pgs.

"U.S. Appl. No. 11/268,154, Response filed Dec. 4, 2008 to Non-Final Office Action mailed Aug. 4, 2008", 13 pgs.

"U.S. Appl. No. 11/318,797, Non-Final Office Action mailed Aug. 19, 2008", OARN, 30 pgs.

"U.S. Appl. No. 11/318,797, Restriction Requirement mailed May 5, 2008", 4 pgs.

"U.S. Appl. No. 11/318,797, Non-Final Office Action mailed Aug. 19, 2008", 30 pgs.

"U.S. Appl. No. 11/318,797, Notice of Allowance mailed Dec. 31, 2009", 12 pgs.

"U.S. Appl. No. 11/318,797, Preliminary Amendment and Response filed Jun. 4, 2008 to Restriction Requirement mailed May 15, 2008", 11 pgs.

"U.S. Appl. No. 11/318,797, Preliminary Amendment filed Apr. 10, 2006", 32 pages.

"U.S. Appl. No. 11/318,797, Response filed Nov. 19, 2008 to Non-Final Office Action mailed Aug. 19, 2008", 24 pgs.

"U.S. Appl. No. 11/318,797, Supplemental Notice of Allowability Mailed Mar. 10, 2010", 5 pgs.

"U.S. Appl. No. 11/421,161, Non-Final Office Action mailed Mar. 9, 2009", 8 pgs.

"U.S. Appl. No. 11/421,161, Non-Final Office Action mailed Oct. 5, 2009", 11 pgs.

"U.S. Appl. No. 11/421,161, Response filed Jun. 9, 2009 to Non Final Office Action mailed Mar. 9, 2009", 11 pgs.

"U.S. Appl. No. 11/467,480 , Notice of Allowance mailed Jan. 12, 2010", 7 pgs.

"U.S. Appl. No. 11/467,480, Final Office Action mailed Aug. 20, 2008", 9 pgs.

"U.S. Appl. No. 11/467,480, Non-Final Office Action mailed Feb. 21, 2008", 3 pgs.

"U.S. Appl. No. 11/467,480, Notice of Allowance mailed Mar. 9, 2009", 4 pgs.

"U.S. Appl. No. 11/467,480, Notice of Allowance mailed Jul. 6, 2009", 5 pgs.

"U.S. Appl. No. 11/467,480, Response filed Jan. 21, 2008 to Restriction Requirement mailed Jan. 8, 2008", 1 pg.

"U.S. Appl. No. 11/467,480, Response filed May 21, 2008 to Non-Final Office Action mailed Feb. 21, 2008", 18 pgs.

"U.S. Appl. No. 11/467,480, Response filed Dec. 19, 2008 to Final Office Action mailed Aug. 20, 2008", 13 pgs.

"U.S. Appl. No. 11/467,480, Restriction Requirement mailed Jan. 8, 2008", 6 pgs.

"U.S. Appl. No. 11/553,313, Amendment and Response filed Apr. 2, 2008 to Non-Final Office Action mailed Jan. 2, 2008", 8 pgs.

"U.S. Appl. No. 11/553,313, Non-Final Office Action mailed Jan. 2, 2008", 12 pgs.

"U.S. Appl. No. 11/553,313, Notice of Allowance mailed Feb. 25, 2009", 6 pgs.

"U.S. Appl. No. 11/553,313, Notice of Allowance mailed Jun. 2, 2008", 6 pgs.

"U.S. Appl. No. 11/553,313, Notice of Allowance mailed Jun. 15, 2009", 6 pgs.

"U.S. Appl. No. 11/553,313, Notice of Allowance mailed Sep. 25, 2008", 6 pgs.

"U.S. Appl. No. 11/553,333, Amendment and Response filed Jun. 30, 2008 to Non-Final Office Action mailed Apr. 3, 2008", 13 pgs.

"U.S. Appl. No. 11/553,333, Non-Final Office Action mailed Apr. 3, 2008", 7 pgs.

"U.S. Appl. No. 11/553,333, Notice of Allowance mailed Jan. 2, 2009", 5 pgs.

"U.S. Appl. No. 11/553,333, Notice of Allowance mailed Sep. 8, 2008", 5 pgs.

"U.S. Appl. No. 11/553,333, Response filed Jun. 30, 2008 to Non-Final Office Action mailed Apr. 3, 2008", 13 pgs.

"U.S. Appl. No. 11/554,430, Non-Final Office Action mailed Sep. 30, 2008", 11 pgs.

"U.S. Appl. No. 11/554,430, Notice of Allowance mailed Jan. 19, 2010", 5 pgs.

"U.S. Appl. No. 11/554,430, Notice of Allowance mailed Aug. 4, 2009", 7 pgs.

"U.S. Appl. No. 11/554,430, Response and Preliminary Amendment filed Apr. 11, 2008 to Restriction Requirement mailed Mar. 13, 2008", 9 pgs.

"U.S. Appl. No. 11/554,430, Response filed Dec. 30, 2008 to Non Final Office Action mailed Sep. 30, 2008", 15 pgs.

"U.S. Appl. No. 11/554,430, Restriction Requirement mailed Mar. 13, 2008", 6 pgs.

"U.S. Appl. No. 11/554,796, Notice of Allowance mailed Jan. 5, 2009", 9 pgs.

"U.S. Appl. No. 11/554,796, Restriction Requirement mailed Aug. 7, 2008", 6 pgs.

"U.S. Appl. No. 12/114,571, Amendment and Response filed Feb. 5, 2009 to Non-Final Office Action mailed Nov. 5, 2008", 13 pgs.

"U.S. Appl. No. 12/114,571, Final Office Action mailed Nov. 6, 2009", 3 pgs.

"U.S. Appl. No. 12/114,571, Non-Final Office Action mailed Nov. 5, 2008", 13 pgs.

"U.S. Appl. No. 12/114,571, Notice of Allowance mailed Apr. 24, 2009", 7 pgs.

"Application Serial No. PCT/US07/68107 International Preliminary Report on Patentability Date Mailed Oct. 9, 2009", 7.

"U.S. Appl. No. 11/268,154, Final Office Action mailed Apr. 1, 2010", 17 pgs.

"International Application Serial No. PCT/US07/68107, International Search Report mailed Oct. 23, 2007", 1 pg.

"International Application Serial No. PCT/US07/80723, International Search Report mailed Mar. 6, 2008", 2 pgs.

"International Application Serial No. PCT/US07/80723, Written Opinion mailed Mar. 6, 2008", 5 pgs.

"International Application Serial No. PCT/US07/80830, International Search Report mailed Mar. 6, 2008", 2 pgs.

"International Application Serial No. PCT/US07/80830, Written Opinion mailed Mar. 6, 2008", 4 pgs.

"International Application Serial No. PCT/US07/80994, International Search Report mailed May 7, 2008", 2 pgs.

"International Application Serial No. PCT/US07/80994, Written Opinion mailed May 7, 2008", 6 pgs.

"International Application Serial No. PCT/US2006/60555, International Search Report mailed Apr. 29, 2008", 3 pgs.

"International Application Serial No. PCT/US2006/60555, Written Opinion mailed Apr. 29, 2008", 7 pgs.

"International Application Serial No. PCT/US2006/62603, International Search Report mailed Apr. 28, 2008", 2 pgs.

"International Application Serial No. PCT/US2006/62603, Written Opinion mailed Apr. 28, 2008", 4 pgs.

"International Application Serial No. PCT/US2007/068107, International Search Report mailed Oct. 23, 2007".

"International Application Serial No. PCT/US2007/074232, International Search Report mailed Jun. 18, 2008", 2 pgs.

"International Application Serial No. PCT/US2007/074232, Written Opinion mailed Jun. 18, 2008", 5 pgs.

"International Application Serial No. PCT/US2007/080723, International Preliminary Report mailed Feb. 25, 2010", 9 pgs.

"International Application Serial No. PCT/US07/80772, International Search Report mailed Feb. 29, 2008", 2 pgs.

"International Application Serial No. PCT/US07/80772, Written Opinion mailed Feb. 29, 2008", 6 pgs.

Enicks, D., "A Study of Process-Induced Oxygen Updiffusion in Pseudomorphic Boron-Doped Sub-50 nm SiGeC Layers Grown by LPCVD", Electrochemical and Solid-State Letters, 8(10), (2005), G286-G289.

Enicks, D., "Enhanced Carbon Confinement of Ultra Narrow Boron Profiles in SiGeC HBTs", IEEE Transactions on Electronic Devices, 53(8), (2006), 6 pgs.

Enicks, D., et al., "Thermal Redistribution of Oxygen and Carbon in Boron-Doped Pseudomorphic SiGeC Heterojunction Nanometer Base Layers", Journal of the Electrochemical Society, 153(6), (2006), G529-G533.

Enicks, Darwin, "Pseudomorphic Growth of Sub-40 nm Si1-x-yGexCy by LPCVD with Enhanced Boron Confinement and Carrier Transport for Advanced NPN HBTs", White Paper from Atmel Corporation, (Aug. 2003), 11 pgs.

Enicks, Darwin G, et al., "Thermal Redistribution of Oxygen and Carbon in Sub-50 NM Strained Layers of Boron Doped SiGeC", ECS Transactions, vol. 3, No. 7, (2006), 1087-1098.

Gosele, U., et al., "Chapter 7 Thinning Procedures", Science and Technology of Semiconductor Wafer Bonding, Duke University, http://www.duke.edu/web/wblich7/ch7-hpge.html#7.1, (1999), 15 pages.

Houghton, D. C., "Strain relaxation kinetics in Si1−xGex/Si heterostructures", J. Appl. Physics, 70(4), 1991 American Institute of Physics, Institute for Microstructural Sciences, National Research Counsel, Canada, (Aug. 15, 1991), 2136-2151.

Kar, G. S, et al., "Effect of carbon on lattice strain and hole mobility in Si1-xGex alloys", Journal of Materials Science: Materials in Electronics, 13(1), 2002 Kluwer Academic Publishers, U.S., (Jan. 2002), 49-55.

Kasper, et al., "Strain Adjustment with Thin Virtual Substrates", Solid-State Electron. 48,, (2004), 1257.

Kasper, E., et al., "", Properties of Silicon Germanium and SiGe: Carbon, EMIS Datareviews Series No. 24, INSPEC, The Institute of Electrical Engineers, London, United Kingdom, (2000), 358 pgs.

Knoll, D., et al., "Influence of the Oxygen content in SiGe on the Parameters of Si/SiGe Heterojunction Bipolar Transistors", Journal of Electronic Materials 27(9), (1998), 1022-1026.

Matthews, J. W., et al., "Defects in Epitaxial Multilayers", Journal of Crystal Growth, 27, (1974), 118-125.

Neimash, M. V., et al., "Oxygen Precipitation and Thermal Donor Formation in Pb and C Doped n-Type Czochralski Silicon", Proceedings, Electrochemical Society—2004 Joint International Meeting, (Abstract 1075), (2004), 1 pg.

Pavesi, L., "A Review of the Various Efforts to a Silicon Laser", Optoelectronic Integration on Silicon—Proceedings of SPIE, (Photonic West, San Diego, CA, (2003), 15 pgs.

People, R., "Calculation of critical layer thickness versus lattice mismatch for GexSi1-x/Si strained-layer heterostructures", Applied Physics Letters, 47(3), (1985), 322-324.

Rafi, J. M., et al., "Analysis of Oxygen Thermal Donor Formation in n-type Cz Silicon", In: Analytical and Diagnostic Techniques for Semiconductor Materials, Devices, and Processes, (Electrochemical Society), (2003), 1 pg.

\* cited by examiner

INTEGRATED CIRCUIT STRUCTURES CONTAINING A STRAIN-COMPENSATED COMPOUND SEMICONDUCTOR LAYER AND METHODS AND SYSTEMS RELATED THERETO

This application is a continuation-in-part of application Ser. No. 11/268,154, entitled, "Methods for Growing Strain-Compensated Metastable Compound Films (As Amended)" filed on Nov. 7, 2005, which is incorporated herein by reference in its entirety.

TECHNICAL FIELD

The invention generally relates to methods of fabrication of integrated circuits (ICs). More specifically, the invention is a method of fabricating and integrating a metastable silicon-germanium (SiGe) base region into a heterojunction bipolar transistor (HBT).

BACKGROUND ART

The SiGe HBT has significant advantages over a silicon bipolar junction transistor (BJT) in gain, frequency response, noise parameters, and retains an ability to integrate with CMOS devices at relatively low cost. Cutoff frequencies ($F_t$) of SiGe HBT devices have been reported to exceed 300 GHz, which is favorable as compared to GaAs devices. However, GaAs devices are relatively high in cost and cannot achieve the level of integration, such as, for example, of BiCMOS devices. The silicon compatible SiGe HBT provides a low cost, high speed, low power solution that is quickly replacing other compound semiconductor devices.

Advantages of SiGe are realized by a bandgap reduction creating an energy band offset at the Si—SiGe heterojunction(s) of the HBT, thereby resulting in increased current densities for a given base-emitter bias and higher gains. Also, a lower resistivity is possible with addition of Ge to a Si lattice. The higher current densities and lower base resistance values allow improved unity gain cutoff frequencies and maximum oscillation frequencies than comparable silicon BJTs, and are comparable to other compound devices such as GaAs. However, the emitter collector breakdown voltage (especially BVCEO) is inversely proportional to the current gain ($\beta$). The structural and process changes required to enhance $F_t$ and reduce power lead to higher and higher current gains and hence lower and lower collector-emitter breakdown voltages.

Elevated Ge fractions result in an increase in base recombination current and a reduction in current gain for a given layer thickness and doping level. This effect has been confirmed experimentally to extend beyond 30% Ge. References on detect formation in pseudomorphic SiGe with high Ge content suggests the effect will continue to increase for Ge fractions well above 40% (i.e., Kasper et al., "Properties of Silicon Germanium and SiGe:Carbon," INSPEC, 2000). Therefore, a compromise of increasing the Ge fraction high enough to reduce current gain in high-speed devices provides a way to compensate for an inevitable increase in gain and degradation of BVCEO as basewidths continue to shrink.

However, there is a limit to how much Ge can be added to the Si lattice before excess strain relaxation and gross crystalline defects occur. A critical thickness ($h_c$) of a SiGe layer that is lattice matched to the underlying silicon is a function of (1) percentage of Ge; (2) SiGe film thickness; (3) cap layer thickness; (4) temperature of HBT filmstack processing; and (5) temperature of thermal anneals following a silicon-germanium deposition. Above the critical thickness, $h_c$, the SiGe film is in a metastable and/or unstable region, which implies it will relax readily with a large enough application of thermal energy. Therefore, the degree of metastability is largely a function of percent Ge, SiGe layer thickness, cap layer thickness, and process induced strain due to thermal energy. Construction of a SiGe base of a conventional SiGe HBT described to date is that of a stable, pseudomorphic, or lattice-matched layer. Contemporaneous state-of-the-art procedures include growing stable, strained or lattice-matched alloys of SiGe with carbon to prevent spreading of the boron profile in the base region.

Metastable film growth is typically avoided due to the fact that relaxation results in lattice imperfections. These imperfections result in recombination centers; hence, a reduction in minority carrier lifetime ($\tau_b$) and an increase in base recombination current ($I_{RB}$) occurs. If not controlled, a resultant poor crystal quality due to lattice imperfections will degrade device performance. "Bridging" defects will also lead to excessive leakage current along with extremely low current gain. The film will also be very sensitive to process induced thermal stresses and therefore will not be manufacturable. Therefore, to avoid this type of degradation, the HBT designs to date result in a device with a base region that is in the stable region of film growth, which equates to a SiGe thickness that is equal to or below the critical thickness, $h_c$.

Properties of metastable SiGe are discussed in several papers such as D. C. Houghton, "Strain Relaxation Kinetics in $Si_{1-x}Ge_x$/Si Heterostructures," *Journal of Applied Physics*, Vol. 70, pp. 2136-2151 (Aug. 15, 1991), and G. S. Kar et al. "Effect of carbon on lattice strain and hole mobility in $Si_{1-x}Ge_x$ alloys," Dept. of Physics and Meteorology, Indian Institute of Technology, Kharagpur 721302, India, *Journal of Materials Science: Materials in Electronics*, Vol. 13, pp. 49-55 (2002). Further, U.S. Pat. No. 6,586,297 ("the '297 patent") and U.S. Pat. No. 6,781,214 ("the '214 patent"), to U'Ren et at describe a "Metastable Base in a High-Performance HBT" and a "Method for Integrating a Metastable Base into a High Performance HBT and Related Structure," respectively.

The '297 patent describes a heterojunction bipolar transistor that includes a metastable epitaxial silicon-germanium base on a single crystal collector and an emitter situated over a metastable epitaxial SiGe base.

The metastable epitaxial SiGe base is grown in an epitaxial reactor where the metastable epitaxial SiGe base is a strained crystalline structure including a conductivity altering dopant incorporated in-situ during film growth; the dopant is added for the sole purpose of establishing a specific conductivity type. The '297 patent describes a method that includes a short thermal anneal at temperatures of 900° C. to 950° C. to avoid relaxing the metastable SiGe film layer.

The '214 patent describes a heterojunction bipolar transistor fabricated by forming a metastable epitaxial SiGe base on a collector with a concentration of germanium greater than 20 atomic percent. An emitter is then fabricated over the metastable epitaxial SiGe base. The emitter is doped with an n- or p-type impurity depending on the transistor type, npn or pnp. The HBT is then heated in a spike anneal process to maintain the metastable epitaxial silicon-germanium base as a strained crystalline structure and to diffuse the dopants to form the emitter-base junction. The metastable epitaxial SiGe base is grown in an epitaxial reactor where the metastable epitaxial SiGe base is strained crystalline structure including a dopant incorporated in-situ during film growth; the dopant is added for the sole purpose of establishing a specific conductivity type. The '214 patent describes a method that includes a short thermal anneal at temperatures of 900° C. to 950° C. to avoid relaxing the metastable SiGe film layer.

However, the methods described in these afore-mentioned references for forming a metastable SiGe film are still very susceptible to adverse effects of thermal stress such as slip dislocations and threading dislocations; all of which are associated with film relaxation. In highly metastable films, relaxation can take place during extremely short time intervals during an anneal process, depending on the degree of metastability, such as the first fraction of a second during a short anneal and/or a flash anneal process.

Therefore, what is needed is a method to grow and integrate strain-compensated metastable SiGe layers for application to a SiGe HBT. Such a method should allow a skilled artisan to, for example, control and utilize defect density for device optimization, achieve extremely high energy band offsets and grades ($\Delta E_G(0)$ & $\Delta E_G(\text{grade})$) without incurring excess "bridging" defects, such as slip or threading dislocations, and provide a method to achieve high volume manufacturability of films that would normally be unreliable and/or unrepeatable due to their extremely metastable or even unstable properties.

Each of these improvements allows the use of films that would otherwise be highly metastable (or even unstable) films in order to realize the advantages offered with high concentrations of Ge.

SUMMARY

The present invention is a method for pseudomorphic growth and integration of a strain-compensated metastable and/or unstable compound base, which may also be in-situ doped, into an electronic device, such as, for example, a SiGe NPN HBT, by substitutional and/or interstitial placement of strain-compensating atomic species. The method allows for control of defect density, and thus resultant control of minority carrier lifetime, base recombination current, base current and current gain, and breakdown. Additionally, the ability to achieve greater Ge fractions than is possible without strain compensation and maintain a strained, lattice matched film enables devices with greater energy band offsets and hence greatly improved current densities and hence significantly improved $F_t$ and $F_{max}$ figures.

The invention also applies to strained layers in a variety of other electronic device types including strained SiGe, strained Ge, and/or strained Si in MOS applications, vertical thin film transistors (VTFT), resonant tunnel diodes (RTD), and a variety of other electronic device types. Heterojunction and heterostructure devices formed from compound semiconductors other than SiGe, such as, for example, GaAs, InP, and AlGaAs may also be amenable to beneficial processes described herein. Any strain-compensating element that will incorporate substitutionally and/or interstitially are amendable to the methods presented herein.

Elements that do not significantly affect the conductivity are oftentimes desirable. Therefore, when using strain compensating group IV semiconductors such as Si, Ge, and/or SiGe it might be desirable to avoid group II/III or group V/VI elements to avoid affecting the conductivity. However, this does not preclude the use of "conductivity altering" elements for the dual purpose of strain compensation and also to effectively alter the conductivity simultaneously.

An electronic device fabricated by the method described herein, in an exemplary embodiment, includes a substrate with a compound semiconductor film disposed over a first surface of the substrate. The compound semiconductor film is deposited in a metastable state by exceeding the critical thickness, $h_c$, for the germanium concentration being used and the thermal cycles employed in the process after the compound semiconductor film has been formed. A substitutional strain-compensating, atomic species (e.g., carbon) is added in-situ during the film growth to control defect density and avoid complete relaxation during the remainder of processing.

DETAILED DESCRIPTION

A strain-compensating atomic species is a species that, when added, alters the lattice parameter of a crystalline film from its intrinsic value. The intrinsic lattice parameter is the lattice parameter of the film or layer without the strain compensating species. For strain compensation of SiGe, one strain-compensating atomic species is carbon. One atomic percent of substitutional carbon will compensate eight percent to ten percent of Ge. Additionally, carbon can be substitutionally placed to approximately 2.5 percent in SiGe, or enough carbon to strain compensate 20 to 25 percent of Ge. Therefore, pseudomorphic strain-compensated metastable and/or unstable films with Ge levels of greater than 40 percent are possible (i.e., using four percent to five percent carbon) for electronic device use.

Even though one exemplary embodiment provides for strain reduction, a strain compensating atomic species with a larger lattice constant than either Si or Ge could be added to purposely increase strain. This type of strain modification would be suitable as well, for instance as a tool for bandgap and/or lattice engineering; defect engineering could make good use of strain modification as well. Strain modification would also be useful for enhancing carrier mobility in a "strain-compensated film" and any adjacent film layers.

The method described herein differs from previous methods for formation of a SiGe HBT due to an emphasis on intentional growth of a metastable and/or unstable base layer and a calculated incorporation of substitutional and/or interstitial carbon. The substitutional and/or interstitial carbon strain compensates an HBT base region to avoid strain relaxation, and allows defectivity engineering to decouple current gain from IC and $F_t$ enhancement, along with integrating downstream thermal anneal processes thus avoiding excess carbon diffusion and maintaining the film in a strained state.

Figure 1:
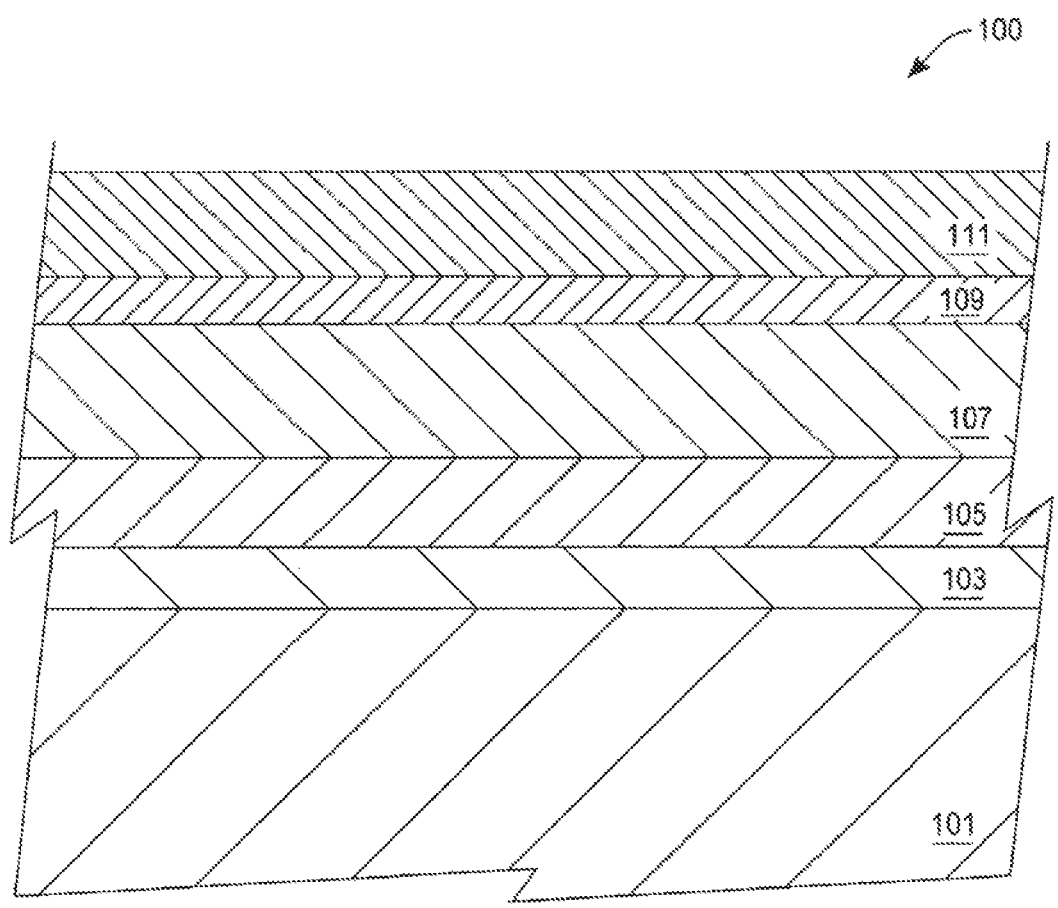
FIG. 1 is an exemplary cross-section of a film stack used in forming a portion of an HBT in accordance with the present invention.

With reference to FIG. 1, an exemplary film stack 100 used in forming a strain-compensated metastable layer of an HBT includes a substrate 101, an epitaxial layer 103, an elemental seed layer 105, a strain-compensated metastable SiGe base region 107, an elemental cap layer 109, and a polysilicon emitter layer 111. One skilled in the art will recognize that other materials may be employed for the emitter layer 111 such as, for example, polySiGe.

In a specific exemplary embodiment, the substrate 101 is a p-type, 20 Ω-cm <100> silicon wafer. The epitaxial layer 103 is grown by LPCVD and can be either p-type or n-type depending on the technology application and the requirements for breakdown voltages and collector resistance.

Arsenic and/or phosphorous may be doped into the epitaxial layer 103 and the substrate 101 to provide a low resistance collector region. The arsenic and phosphorous may be diffused or implanted. If implanted, one skilled in the art will recognize that the energy and dose of the implant must be determined by specific technology requirements for collector resistance, breakdown voltages, etc. A skilled artisan will also recognize that other methods may be employed to dope this region, such as diffusion or LPCVD (in-situ doping).

In the case of a silicon substrate 101, prior to growth, the silicon growth surface should be cleaned (typically with a wet chemistry such as hydrofluoric acid) to remove any native oxidation and surface contaminants. The elemental seedlayer 105, the metastable base region 107, and the elemental cap layer 109 may be fabricated during the same LPCVD process. Temperatures in the range of 500° C. to 900° C. are typically employed for epitaxial growth of each layer. Silane ($SiH_4$) and germane ($GeH_4$) are typical gases for silicon and SiGe deposition. Diborane ($B_2H_6$) and arsine ($AsH_3$) are common p- and n-type dopant sources. Hydrogen ($H_2$) may be utilized as a carrier gas, however other gases such as helium may be used.

In another specific exemplary embodiment, the substrate 101 is a <100> p-type silicon wafer, boron doped to a concentration of approximately $10^{15}$ atoms/$cm^3$. Alternatively, the substrate 101 could also be, for example, an n-type silicon wafer or a substrate comprised of a compound semiconducting material such as silicon-germanium of either p-type or n-type conductivity. The substrate 101 may also be silicon-on-insulator (SOI) or silicon germanium-on-insulator. The epitaxial layer 103 is deposited to a thickness of between 0.3 µm and 2 µm, followed by the elemental seed layer 105. The epi layer is typically added as a low doped region to tailor breakdown voltages and/or collector resistance.

In this embodiment, the elemental seed layer 105 is comprised of silicon, which is epitaxially grown to a thickness range of 10 nm to 100 nm, although other semiconducting materials may be employed, such as silicon germanium with very low Ge content. The strain-compensated metastable SiGe layer 107 is deposited to a thickness greater than the critical thickness, $h_c$, followed by the elemental cap layer 109 comprised of, for example, silicon.

The critical thickness, $h_c$, is determined based on atomic percentage of Ge within an upper and lower bound of a metastable region. This critical thickness determination is based on historical work of People/Bean and Matthews/Blakeslee, and is known in to one of skill in art.

Figure 2:
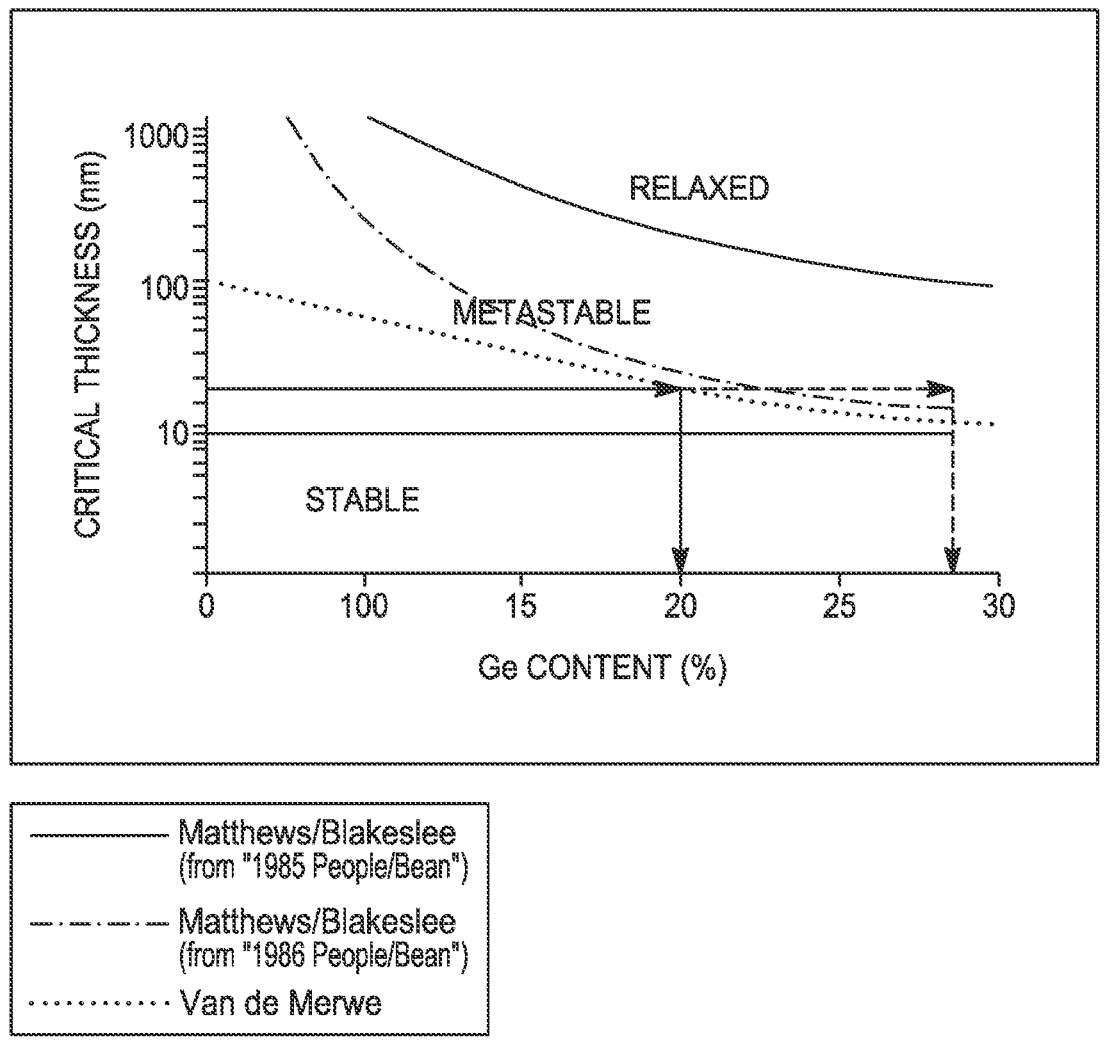
FIG. 2 is a curve depicting critical thickness as a function of Ge content.

As an example, FIG. 2 shows that for a film with 20% Ge, the critical thickness, $h_c$, according to the Van de Merwe curve (shown in *The calculation of critical layer thickness versus lattice mismatch for GexSi1-x/Si strained-layer heterostructures*," R. People and J. C. Bean, Appl. Phys. Lett., Vol. 47, No. 3, p. 322, 1 Jul. 1985 (hereinafter "1985 People/Bean") and *Erratum: The calculation of critical layer thickness versus lattice mismatch for GexSi1-x/Si strained-layer heterostructures*," R. People and J. C. Bean, Appl. Phys. Lett., Vol. 49, No. 4, p. 229, 28 Jul. 1986 (hereinafter 1986 People/Bean")), a portion of which is reproduced in FIG. 2, is defined by the bottom edge of the metastable region is approximately 20 nm, white a film with 28% Ge has an $h_c$ of only 9 nm. Therefore, to grow a fully "strain compensated" film with 28% Ge that is also 20 nm thick, carbon may be added to reduce the lattice parameter and strain compensate 8% of Ge. The addition of 1% of carbon throughout the SiGe lattice of a 20 nm, 28% Ge film will reduce the strain to a level that approximates that of a 20 nm, 20% Ge film. However, one skilled in the art will recognize that it might be technologically desirable to provide only enough carbon to partially strain compensate, for example, adding 0.5% carbon for purposes of defect engineering. Alternatively, 2% carbon may be added for purposes of adding thermal processing robustness.

FIG. 2 also shows a portion of the Matthews/Blakeslee curve from "1985 People/Bean" and a portion of the corrected Matthews/Blakeslee curve from "1986 People/Bean."

Additionally, one may desire to grow a film that resides well into the metastable region, and then to only partially compensate the film so-as to maintain a certain degree of metastability for defect and/or lattice engineering.

Figure 3:
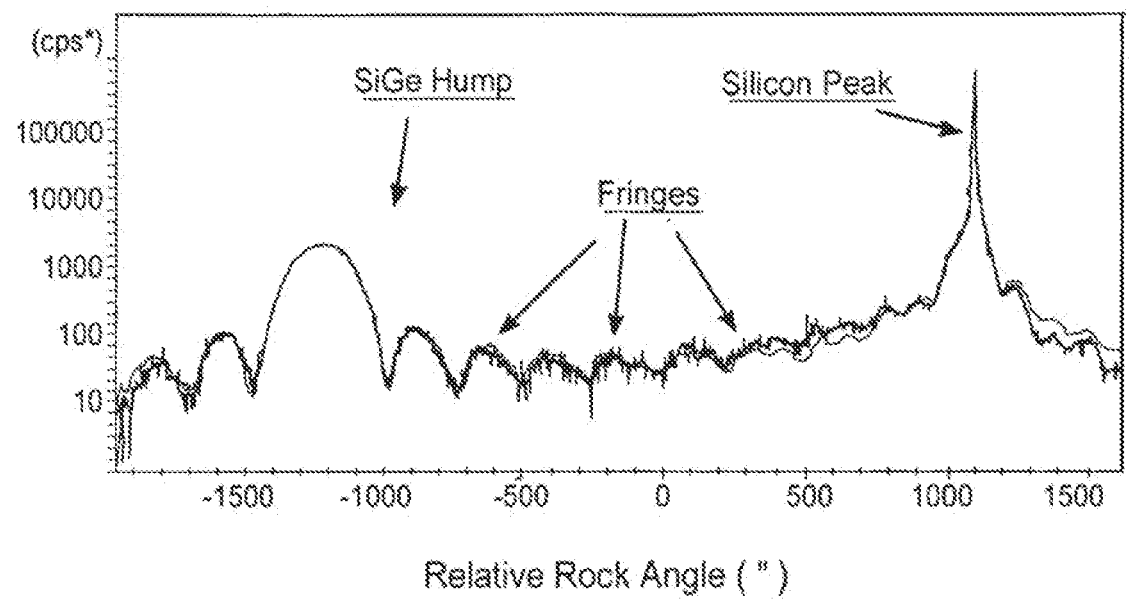
FIG. 3 is an Xrd rocking curve of a strained, lattice-matched metastable SiGe film.

One skilled in the art will recognize that data and charts such as those of FIG. 2 are meant to provide approximations, but that other means, such as Xrd rocking curves are necessary to assist in determining where optimum degree of metastability resides for a certain film structure and/or device. With reference to FIG. 3, one skilled in the art will know that distinct "fringe rings" between the silicon peak and the "SiGe hump" are indicative of lattice matched or strained layer.

Figure 4:
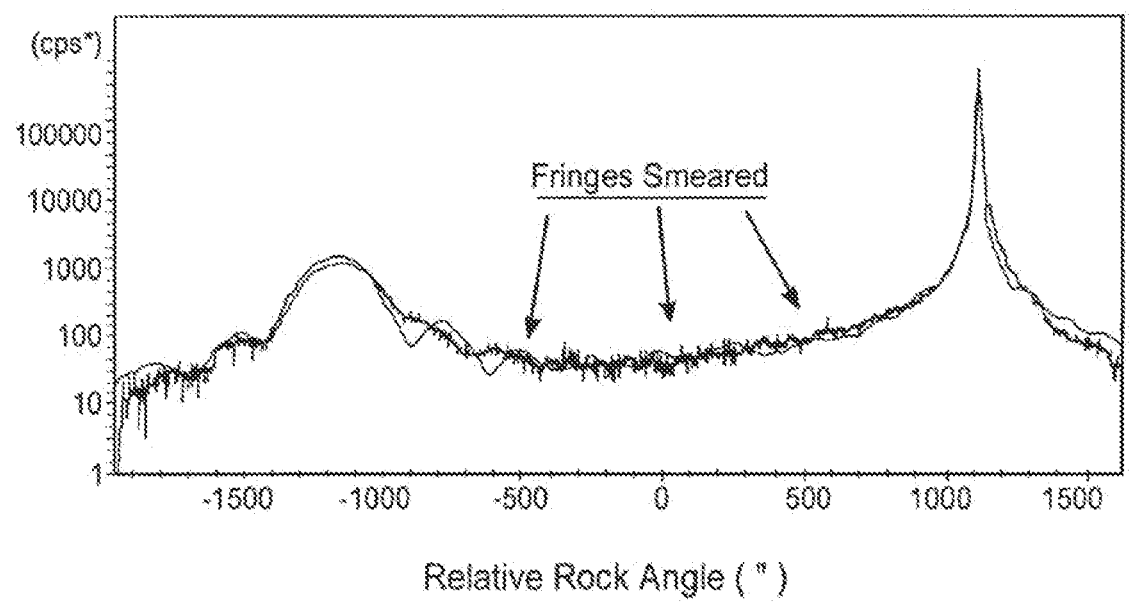
FIG. 4 is the Xrd rocking curve of FIG. 3 after a thermal anneal.

The absence of and/or "smearing" of fringes in the Xrd rocking curves will indicate a film relaxation (FIG. 4) following a thermal anneal cycle. One skilled in the art will also know that Xrd rocking curves assessed following film growth and also following the downstream thermal treatments will provide information necessary for tailoring of the strain compensation process and/or thermal processes to avoid complete strain or lattice relaxation.

Other experimental approaches may be utilized, such as putting electrical devices through electrical testing to identify the acceptable level of strain compensation for a particular device or technology. This acceptable level will be determined by device electrical parameters, especially the collector current, base current, current gain, and breakdown voltages for an HBT. Other electrical parameters may be characterized and controlled for other device types and/or technologies.

Individual processes should be characterized with experimental methods to determine where their process resides with respect to the stable/metastable/relaxed regions as depicted by theoretical and empirically derived charts such as those discussed supra. This characterization will require analysis by such means of Xrd rocking curves, device electrical tests, and SIMS (secondary ion mass spectrometry) to reveal dopant diffusion, especially of strain compensating species such as carbon.

Even without the charts, the Xrd rocking curves can provide the quantitative and qualitative data necessary for developing strain compensated films, and that the "rule of thumb" for 1% carbon to compensate 8% to 10% Ge is a generally accepted guideline. Some metastable and/or unstable films and/or devices might require more or less carbon, depending on such factors as the film geometry, thermal stresses, and physically induced stresses (from adjacent films and structures) not accounted for in contemporary theoretical and empirical bodies of knowledge. Therefore, the guidelines provided herein will facilitate a development of metastable "strain compensated" films and/or devices and are intended as a system for providing an improved process and device. The guidelines also provide greater degrees of design engineering flexibility for bandgap engineering (i.e. $J_c$, $F_t$, $F_{max}$) and defectivity and/or lattice engineering (i.e., minority carrier lifetime engineering, base recombination current engineering, base current engineering, current gain engineering, and breakdown optimization).

With further reference to FIG. 1, the polysilicon emitter layer 111, in this exemplary embodiment, is comprised of n-type polysilicon that may be deposited to a thickness between 0.05 μm and 0.30 μm. However, other films such as polySiGe may also be employed.

A carbon precursor (for example, methane ($CH_4$) or acetylene ($C_2H_2$)) is utilized during growth of the strain-compensated metastable SiGe layer 107 to add carbon. Precursors for formation of the strain-compensated metastable SiGe layer 107 include, for example, methyl silane ($CH_3SiH_3$), silane ($SiH_4$), and germane ($GeH_4$) for the carbon, silicon, and germanium components respectively. Hydrogen ($H_2$) is typically employed as a carrier gas for all layer depositions. In-situ doping with a conductivity altering dopant of a thin section near the center of the strain-compensated metastable SiGe layer 107 creates a p-type neutral base region. This neutral base region is sandwiched between two SiGe setback or spacer layers (not shown). The p-type impurity may be boron, commonly supplied with a diborane ($B_2H_6$) precursor. The elemental cap layer 109 is epitaxially grown on top of the strain-compensated metastable SiGe layer 107. The elemental cap layer 109 (silicon) maintains the SiGe layer in a strained state. Cap layers are typically grown with a thickness between 0.05 μm and 0.1 μm. A skilled artisan will recognize that the cap layer maintains strain equilibrium within the SiGe layer, and that the thickness is tailored as appropriate.

A profile of the Ge associated with the strain-compensated metastable SiGe layer 107 is generally that of a trapezoid, although a skilled artisan will recognize that other Ge profiles, such as triangular, box, or profiles with curvature are possible. The polysilicon emitter layer 111 may be, for example, n-type in-situ doped polysilicon. Arsine ($ASH_3$) may be used as an n-type dopant precursor employing hydrogen as a carrier gas for the process. The emitter layer 111 may be monocrystalline, polycrystalline, amorphous, or a compound material of a mono, or amorphous construction. In a specific exemplary embodiment, a SiGe deposition temperature is in the range of 550° C. to 650° C., although temperatures less than 600° C. may be preferred for many advanced fabrication processes in general, with a processing pressure range of 1 torr to 100 torr. Pseudomorphic SiGe growth is possible at higher temperatures, such as up to or even exceeding 900° C.

Although the present invention is described in terms of exemplary embodiments, a skilled artisan will realize that techniques described herein can readily be adapted to other forms of fabrication techniques and devices. For example, the strain-compensation techniques could be applied to other technologies such as FinFET, surround gate FET, vertical thin film transistors (VTFT), hyper-abrupt junctions, resonant tunnel diodes (RTD), and optical waveguides for photonics. Therefore, profiles, thicknesses, and concentrations of the strain-compensated metastable SiGe layer 107 can be selected to accommodate a variety of needs. The metastable SiGe layer 107 could also be strain compensated with other elements, which may induce a diminished diffusivity for a given dopant type.

Also, although process steps and techniques are described in detail, a skilled artisan will recognize that other techniques and methods may be utilized, which are still included within a scope of the appended claims. For example, there are several techniques used for depositing and doping a film layer (e.g., chemical vapor deposition, plasma-enhanced chemical vapor deposition, molecular beam epitaxy, atomic layer deposition, etc.). Although not all techniques are amenable to all film types described herein, one skilled in the art will recognize that multiple and alternative methods may be utilized for depositing or otherwise forming a given layer and/or film type.

Additionally, many industries allied with the semiconductor industry could make use of the strain-compensation technique. For example, a thin-film head (TFH) process in the data storage industry, an active matrix liquid crystal display (AMLCD) in the flat panel display industry, or the microelectromechanical industry (MEM) could readily make use of the processes and techniques described herein. The term "semiconductor" should thus be recognized as including the aforementioned and related industries. The drawing and specification are, accordingly, to be regarded in an illustrative rather than a restrictive sense.

What is claimed is:

1. An integrated circuit structure comprising:
a substrate based on silicon; and
an epitaxial layer formed on a surface of the substrate, an elemental seed layer formed atop the epitaxial layer and a compound semiconductor layer including a silicon-germanium base region disposed on a surface of the elemental seed layer, the compound semiconductor layer having a thickness in an order of 20 nano-meters with a concentration of germanium in the silicon-germanium base region in an order of 28%, wherein the compound semiconductor layer is doped with a strain-compensating atomic species with a doping concentration of the strain-compensating atomic species in an order of 1% to fully strain-compensate the compound semiconductor layer for the particular thickness and concentration of germanium.

2. The integrated circuit structure of claim 1, wherein the concentration of germanium in the silicon-germanium base region is sufficient to keep the compound semiconductor layer in a metastable state without doping with the strain-compensating atomic species.

3. The integrated circuit structure of claim 1, wherein the strain-compensated compound semiconductor layer has an increased lattice strain as compared to a lattice strain of a compound semiconductor layer not doped with the strain-compensating atomic species.

4. The integrated circuit structure of claim 1, wherein the strain-compensating atomic species is carbon.

5. The integrated circuit structure of claim 4, wherein a ratio of the doping concentration of carbon and the concentration of germanium ranges from 1:8 to 1:10.

6. The integrated circuit structure of claim 1, comprising an electronic device.

7. The integrated circuit structure of claim 6, wherein the electronic device is a heterojunction bipolar transistor (HBT).

8. The integrated circuit structure of claim 6, wherein the electronic device is a metal oxide semiconductor (MOS) device, a vertical thin film transistor (VTFT) or a resonant tunnel diode (RTD).

9. A system comprising:
an integrated circuit structure including:
a substrate based on silicon; and
an epitaxial layer formed on a surface of the substrate, an elemental seed layer formed atop the epitaxial layer and a compound semiconductor layer including a silicon-germanium base region disposed on a surface of the elemental seed layer, the compound semiconductor layer having a thickness in an order of 20 nano-meters with a concentration of germanium in the silicon-germanium base region in an order of 28%, wherein the compound semiconductor layer is doped with a strain-compensating atomic species with a doping concentration of the strain-compensating atomic species in an order of 1% to fully strain-compensate the compound semiconductor layer for the particular thickness and concentration of germanium; and a data storage device, an active matrix liquid crystal display (AMLCD) or a micro-electromechanical (MEM) device coupled to the integrated circuit structure.

10. The integrated circuit structure of claim 2, wherein the thickness of the compound semiconductor layer is greater than a critical thickness that is based in part on thermal cycles employed in a manufacturing process associated with the integrated circuit structure subsequent to formation of the compound semiconductor layer.

11. The system of claim 9, wherein the concentration of germanium in the silicon-germanium base region is sufficient to keep the compound semiconductor layer in a metastable state without doping with the strain-compensating atomic species.

12. The system of claim 11, wherein the thickness of the compound semiconductor layer is greater than a critical thickness that is based in part on thermal cycles employed in a manufacturing process associated with the integrated circuit structure.

13. The system of claim 9, wherein the strain-compensating atomic species is carbon.

14. The system of claim 13, wherein a ratio of the doping concentration of carbon and the concentration of germanium ranges from 1:8 to 1:10.

15. An integrated circuit structure comprising:
a substrate based on silicon;
an epitaxial layer formed on a surface of the substrate and including a low resistance collector region;
an elemental seed layer formed atop the epitaxial layer;
a silicon-germanium base region formed atop the elemental seed layer having a thickness in an order of 20 nanometers with a concentration of germanium in the silicon-germanium base region in an order of 28%, the silicon-germanium base region doped with carbon having a doping concentration in an order of 0.5% to partially strain-compensate the silicon-germanium base region for the particular thickness and concentration of germanium;
an elemental cap layer atop the silicon-germanium base region that is configured to maintain the silicon-germanium base region in a strained state; and
a polysilicon emitter layer atop the elemental cap layer.

* * * * *

UNITED STATES PATENT AND TRADEMARK OFFICE
CERTIFICATE OF CORRECTION

PATENT NO. : 8,530,934 B2  Page 1 of 1
APPLICATION NO. : 12/901867
DATED : September 10, 2013
INVENTOR(S) : Darwin Gene Enicks It is certified that error appears in the above-identified patent and that said Letters Patent is hereby corrected as shown below:

Title Page 4, item (56), Col. 2, Line 11 Delete "Counsel," and insert --Council,--, therefor.

In the Specification

In Column 1, Line 52 Delete "detect" and insert --defect--, therefor.

In Column 4, Line 3-4 Delete "strain-compensating," and insert --strain-compensating--, therefor.

In Column 5, Line 60 Delete "white" and insert --while--, therefor.

Column 6, Line 15 After "where" insert --an--.

Column 7, Line 34 After "mono," insert --poly,--.

Signed and Sealed this
Nineteenth Day of November, 2013

Teresa Stanek Rea
*Deputy Director of the United States Patent and Trademark Office*